(12) United States Patent
Woll et al.

(10) Patent No.: US 12,388,270 B2
(45) Date of Patent: Aug. 12, 2025

(54) METHOD FOR OPERATING AN ELECTRICAL ENERGY STORE, ELECTRICAL ENERGY STORE AND DEVICE

(71) Applicant: Robert Bosch GmbH, Stuttgart (DE)

(72) Inventors: Christoph Woll, Gerlingen (DE); Gunther Handte, Unterensingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/614,721

(22) PCT Filed: May 7, 2020

(86) PCT No.: PCT/EP2020/062701
§ 371 (c)(1),
(2) Date: Nov. 29, 2021

(87) PCT Pub. No.: WO2020/244880
PCT Pub. Date: Dec. 10, 2020

(65) Prior Publication Data
US 2022/0231517 A1     Jul. 21, 2022

(30) Foreign Application Priority Data

Jun. 3, 2019   (DE) .................. 10 2019 208 042.1

(51) Int. Cl.
*H02J 7/00*  (2006.01)
*B60L 58/22* (2019.01)
(Continued)

(52) U.S. Cl.
CPC ............ *H02J 7/0013* (2013.01); *B60L 58/22* (2019.02); *G01R 31/3835* (2019.01);
(Continued)

(58) Field of Classification Search
CPC .... G01R 31/3835; B60L 58/22; H02J 7/0013; H02J 7/0025; H02J 7/0048; H01M 50/512; H01M 10/425; H01M 10/482
(Continued)

(56) References Cited

U.S. PATENT DOCUMENTS 5,592,067 A  *  1/1997  Peter .................... H02J 7/0018
                                                            320/118
5,869,950 A     2/1999  Hoffman, Jr. et al.
(Continued)

FOREIGN PATENT DOCUMENTS

CN       203103992 U  *  7/2013
CN       106329640 B  * 10/2018  ............ H02J 7/0014
(Continued)

OTHER PUBLICATIONS

International Search Report for PCT/EP2020/062701 Issued Jun. 24, 2020.

*Primary Examiner* — John T Trischler
(74) *Attorney, Agent, or Firm* — NORTON ROSE FULBRIGHT US LLP

(57) ABSTRACT

A method for operating an electrical energy store, which includes at least two electrical energy store modules connected in parallel and a connector. It is initially queried which electrical energy store modules are operational. A first voltage of an operational electrical energy store module is then determined, which is greater than or equal to the voltage of all operational electrical energy store modules. Those operational electrical energy store modules are then selected, whose voltage is within a voltage range below the first voltage. The selected electrical energy store modules are then electroconductively connected to the connector.

12 Claims, 3 Drawing Sheets

(51) Int. Cl.
*G01R 31/3835* (2019.01)
*H01M 10/42* (2006.01)
*H01M 10/48* (2006.01)
*H01M 50/512* (2021.01)
*B60L 50/60* (2019.01)
*B60L 58/24* (2019.01)
*B60R 16/033* (2006.01)

(52) U.S. Cl.
CPC ....... *H01M 10/425* (2013.01); *H01M 10/482* (2013.01); *H01M 50/512* (2021.01); *H02J 7/0048* (2020.01); *B60L 50/60* (2019.02); *B60L 58/24* (2019.02); *B60R 16/033* (2013.01); *H01M 2010/4271* (2013.01)

(58) Field of Classification Search
USPC .......................................................... 320/126
See application file for complete search history.

(56) References Cited

U.S. PATENT DOCUMENTS

| | | | | |
|---|---|---|---|---|
| 6,137,262 | A * | 10/2000 | Hauer | H02J 7/00047 320/132 |
| 6,404,165 | B1 * | 6/2002 | Shinpo | B60L 58/10 320/124 |
| 6,420,852 | B1 * | 7/2002 | Sato | H01M 10/482 320/134 |
| 7,417,405 | B2 * | 8/2008 | Carrier | H01M 10/4257 320/116 |
| 7,564,216 | B2 * | 7/2009 | Carrier | H01M 10/4257 320/116 |
| 9,415,699 | B2 * | 8/2016 | Morioka | H01M 10/482 |
| 9,543,767 | B2 * | 1/2017 | Wada | B60L 58/12 |
| 9,620,969 | B2 * | 4/2017 | Kobayashi | H02J 7/0016 |
| 9,722,435 | B2 * | 8/2017 | Park | H02J 7/0014 |
| 9,748,777 | B2 * | 8/2017 | Owen | B60L 50/51 |
| 9,849,803 | B2 * | 12/2017 | Morioka | B60L 58/13 |
| 9,899,856 | B2 * | 2/2018 | Lee | H02J 7/34 |
| 9,960,611 | B2 * | 5/2018 | Toya | H02J 7/0048 |
| 10,224,739 | B2 * | 3/2019 | Kaag | H01M 10/441 |
| 10,263,434 | B2 * | 4/2019 | Miyamoto | H01M 10/434 |
| 10,270,265 | B2 * | 4/2019 | Owen | B60L 3/04 |
| 10,297,877 | B2 * | 5/2019 | Kagawa | H02J 7/0048 |
| 10,491,007 | B2 * | 11/2019 | Kim | H02J 7/0018 |
| 10,576,840 | B2 * | 3/2020 | Naidu | B60L 58/21 |
| 11,133,677 | B2 * | 9/2021 | Tabuchi | H02J 7/34 |
| 11,865,925 | B2 * | 1/2024 | Weber | B60L 7/10 |
| 11,888,334 | B2 * | 1/2024 | Sergott | H02J 7/0013 |
| 2002/0070707 | A1 * | 6/2002 | Sato | H01M 10/482 320/134 |
| 2006/0071643 | A1 * | 4/2006 | Carrier | H01M 10/4257 320/132 |
| 2008/0185995 | A1 * | 8/2008 | Carrier | H02J 7/0048 320/134 |
| 2008/0272739 | A1 * | 11/2008 | Carrier | H02J 7/0014 320/134 |
| 2012/0133333 | A1 * | 5/2012 | Morioka | H02J 7/0049 320/134 |
| 2013/0169038 | A1 * | 7/2013 | King | H02J 7/0031 307/66 |
| 2015/0002095 | A1 * | 1/2015 | Wada | H02J 7/0013 320/112 |
| 2015/0048794 | A1 * | 2/2015 | Park | H02J 7/345 320/118 |
| 2015/0194707 | A1 * | 7/2015 | Park | H01M 10/425 429/61 |
| 2015/0229140 | A1 * | 8/2015 | Kim | H02J 7/0016 320/118 |
| 2015/0280466 | A1 * | 10/2015 | Owen | B60L 50/51 320/137 |
| 2015/0314701 | A1 * | 11/2015 | Morioka | H02J 7/0049 320/134 |
| 2015/0357843 | A1 * | 12/2015 | Kobayashi | H02J 7/0016 320/118 |
| 2016/0043578 | A1 * | 2/2016 | Miyamoto | H01M 10/482 320/118 |
| 2016/0156220 | A1 * | 6/2016 | Kaag | H05B 47/165 307/20 |
| 2016/0190821 | A1 * | 6/2016 | Lee | H02J 7/007 320/134 |
| 2017/0117721 | A1 * | 4/2017 | Toya | H02J 7/0016 |
| 2017/0141588 | A1 * | 5/2017 | Kim | H02J 7/0018 |
| 2017/0317508 | A1 * | 11/2017 | Owen | B60L 3/04 |
| 2017/0373355 | A1 * | 12/2017 | Kagawa | H02J 7/0048 |
| 2018/0029588 | A1 * | 2/2018 | Naidu | B60L 58/10 |
| 2020/0373760 | A1 * | 11/2020 | Tabuchi | H02J 7/35 |
| 2022/0131388 | A1 * | 4/2022 | Sergott | H02J 3/32 |
| 2022/0250478 | A1 * | 8/2022 | Weber | B60L 50/60 |
| 2023/0050505 | A1 * | 2/2023 | Magadi | B60L 58/16 |
| 2024/0088691 | A1 * | 3/2024 | Chung | H02J 7/007182 |

FOREIGN PATENT DOCUMENTS

DE 102018108041 A1 * 10/2019 .......... H01M 10/441
EP 2463981 A1 6/2012

* cited by examiner

METHOD FOR OPERATING AN ELECTRICAL ENERGY STORE, ELECTRICAL ENERGY STORE AND DEVICE

FIELD

The present invention relates to a method for operating an electrical energy store, to an electrical energy store and to a device, in particular a vehicle.

BACKGROUND INFORMATION

U.S. Patent Application Publication No. 2013/0169038 shows a device for the uninterrupted power supply of an electric vehicle from serially interconnected batteries, which includes a bridging switch.

China Patent Publication No. CN 203103992 U shows a control system for a battery charging management and battery discharging management.

SUMMARY

In accordance with an example embodiment of the present invention, in a method for operating an electrical energy store which includes at least two electrical energy store modules connected in parallel and a connection means (i.e., connector), it is initially queried which electrical energy store modules are operational, a first voltage of an operational electrical energy store module then being determined, which is greater than or equal to voltage U of all operational electrical energy store modules, those operational electrical energy store modules then being selected, whose voltage is within a voltage range below the first voltage, the selected electrical energy store modules then being electroconductively connected to the connection means.

With the aid of the method of the example embodiment of the present invention, it is possible to put into operation electrical energy store modules of an electrical energy store, which have various charge states and/or various voltages and/or various points in time of operational readiness.

The electrical energy store in this case is advantageously switched on with reduced power as compared to its maximum power and the power of the electrical energy store is gradually increased during the method by connecting further electrical energy store modules. The voltage range includes the voltage of the operational electrical energy store module having the maximum first voltage. As a result, the number of the connected electrical energy store modules may be maximized during the method, since the voltage of the electrical energy store modules decreases during discharge.

Further advantageous specific embodiments of the present invention are disclosed herein.

According to one advantageous embodiment of the present invention, if not all electrical energy store modules have been connected to the connection means of the electrical energy store, it is queried again at a later point in time during the operation of the electrical energy store which electrical energy store modules are operational and that electrical energy store module is selected, whose voltage is within the voltage range below a mean voltage of the electrical energy store module electrically connected to the connection means, and is electroconductively connected to the connection means. Thus, electrical energy store modules, which were not yet operable or whose voltage was too low at the start of the method, are connected at a later point in time and thus the available power of the electrical energy store is increased during the method.

In this case, it is advantageous if the aforementioned method steps are repeated until all electrical energy store modules are electroconductively connected to the connection means or the electrical energy store is switched off, the method steps being repeated, in particular, temporally recurrently, in particular, periodically. In this way, further electrical energy store modules may be connected in the course of the method during the operation of the electrical energy store.

It is further advantageous if the number of electrical energy store modules connected to the connection means remains constant if the voltage of a non-operable electrical energy store module is greater than the mean voltage and less than the sum of the mean voltage and of half the voltage range, until this electrical energy store module becomes operational, whereupon it is connected to the connection means, or until the voltage of this electrical energy store module is greater than the sum of the mean voltage and of half the voltage range. Thus, an electrical energy store module, which only later becomes operational and has a high voltage, may still also be put into operation. In this case, it is important that a voltage limiting value is not exceeded, in order to limit the compensating currents between the electrical energy store modules and to thereby protect the switching means (i.e., switch).

It is advantageous in this case if an electrical energy store module, whose voltage is greater than the mean voltage, in particular, greater than the sum of the mean voltage and of half the voltage range, is not electroconductively connected to the connection means, if it becomes operational during the method, in particular, during the entire method. This prevents the switching means from being overloaded during the connection of this electrical energy store module by excessively high compensating currents between the electrical energy store modules.

When switching off the electrical energy store, all electrical energy store modules are advantageously separated from the connection means. In this case, it is advantageous that the connection means of the electrical energy store is voltage-free after the electrical energy store is switched off.

It is further advantageous if the expansion of the voltage range is a function of the electrical energy store, in particular, of switching means of the electrical energy store and/or is constant during the method.

An electrical energy store module is advantageously operational if its temperature and/or its voltage is/are below a maximum limiting value and/or above a minimum limiting value.

In accordance with the present invention, in the electrical energy store including connection means and at least two electrical energy store modules, which are connected in parallel, the electrical energy store is configured to be operated with the aid of a method as described above or as further disclosed herein.

In accordance with the present invention, the electrical energy store modules may have various charge states and points in time of operational readiness. The electrical energy store may be put into operation with a subset of the electrical energy store modules, the available power of the electrical energy store being increasable.

According to one advantageous embodiment of the present invention, the electrical energy store includes a control unit, each electrical energy store module including at least one sensor, in particular, one voltage sensor and/or one temperature sensor, and a switching means for electroconductively connecting the respective electrical energy store module to the connection means of the electrical energy store, the control unit being configured to evaluate signals of the sensors and to activate the switching means. It is advantageous in this case that a central control unit is configured to control the method.

The electrical energy store modules are advantageously designed to be interchangeable. The electrical energy store may, for example, include electrical energy store modules that are variously aged.

In accordance with an example embodiment of the present invention, in the case of the device, in particular, the vehicle, the device includes an electrical energy store as described above and as disclosed hereinafter relating to the electrical energy store.

In accordance with an example embodiment of the present invention, the availability of the device may be improved by being able to connect individual electrical energy store modules in succession and/or in that electrical energy store modules are interchangeable.

The above embodiments and refinements may, if meaningful, be arbitrarily combined with one another. Further possible embodiments, refinements and implementations of the present invention also include not explicitly mentioned combinations of features of the present invention described previously or below with respect to the exemplary embodiments. Those skilled in the art will, in particular, also add individual aspects as improvements on or additions to the respective basic form of the present invention, in view of the disclosure herein.

BRIEF DESCRIPTION OF THE DRAWINGS

Below, the present invention is explained with reference to exemplary embodiments, from which further inventive features may result which, however, do not limit the scope of the present invention. The exemplary embodiments are represented in the figures.

DETAILED DESCRIPTION OF EXAMPLE EMBODIMENTS

The electrical energy store according to the present invention includes a plurality of electrical energy store modules M1, . . . M10, which are connected in parallel, two connection means (i.e., connectors) and a control unit. Each electrical energy store module M1, . . . M10 includes at least one sensor, in particular, one voltage sensor and/or one temperature sensor, and switching means (i.e., switch) for electroconductively connecting respective energy store module M1, . . . M10 to the connection means of the electrical energy store. The control unit is configured to evaluate signals of the sensor and to activate the switching means.

Figure 1:
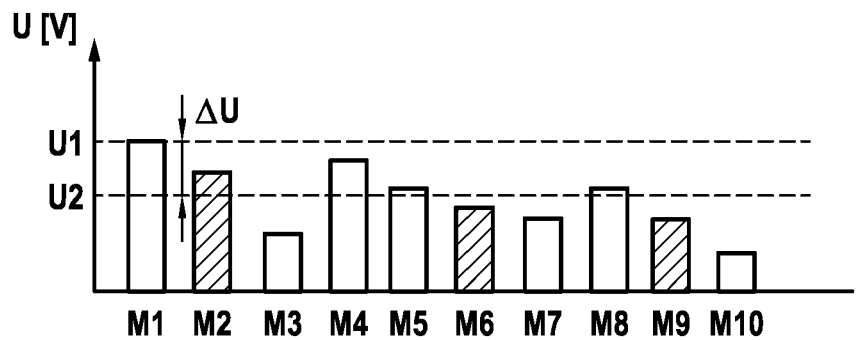
FIG. 1 shows a representation of voltage U and the operational readiness of various electrical energy store modules M1, M2, M3, M4, M5, M6, M7, M8, M9, M10 of an electrical energy store according to an example embodiment of the present invention at a first point in time t1.

The voltages of various electrical energy store modules M1, . . . M10, in this exemplary embodiment ten electrical energy store modules M1, . . . M10 at a first point in time t1 are represented in FIG. 1. In this case, voltage U of an operational electrical energy store module M1, . . . M10 is represented with the aid of a white bar and voltage U of a non-operational electrical energy store module M1, . . . M10 is represented with the aid of a hatched bar.

First point in time t1 is temporally prior to the start-up of the electrical energy store.

At first point in time t1, electrical energy store modules M1, . . . M10 have different voltages. Seven electrical energy store modules M1, M3, M4, M5, M7, M8, M10 are operational. Three further electrical energy store modules M2, M6, M9 are not operational.

A first electrical energy store module M1 has a first voltage U1, which is greater than the voltages of other electrical energy store modules M2, . . . M10 of the electrical energy store. The electrical energy store has a voltage range $\Delta U$, within which electrical energy store modules M1, . . . M10 having various voltages U may be put into operation. Those electrical energy store modules M1, . . . M10, which are operational and which have the highest voltages, are preferably initially put into operation. These are operational electrical energy store modules M1, . . . M10, whose voltage is between first voltage U1 and a second voltage U2. First voltage U1 in this case limits voltage range $\Delta U$ upwardly and second voltage U2 limits voltage range $\Delta U$ downwardly. Second voltage U2 is therefore lower by $\Delta U$ than first voltage U1.

The expansion of voltage range $\Delta U$ in this case is a function of the electrical energy store, in particular, of the switching means of the electrical energy store, and unchangeable during the method. It is based on the maximally allowed current strength at the switching means under load, which includes compensating currents between the interconnected electrical energy store modules. Voltage range $\Delta U$ has an expansion, which is less than 5 V, in particular, less than 3 V, preferably approximately 1 V. As a result, the compensating currents between electrical energy store modules M1, . . . M10 are limited to less than 25 A. These values correspond to a variance of the charge state of 5% between the electrical energy store modules.

In this exemplary embodiment, first electrical energy store module M1, fourth electrical energy store module M4, fifth electrical energy store module M5 and eighth electrical energy store module M8 each have a voltage U, which is within voltage range $\Delta U$ between first voltage U1 and second voltage U2, and are operational. Voltage U of second electrical energy store module M2 is in fact within voltage range $\Delta U$, but second electrical energy store module M2 is not operational. Voltages U of remaining electrical energy store modules M3, M6, M7, M9, M10 are below second voltage U2.

Figure 2:
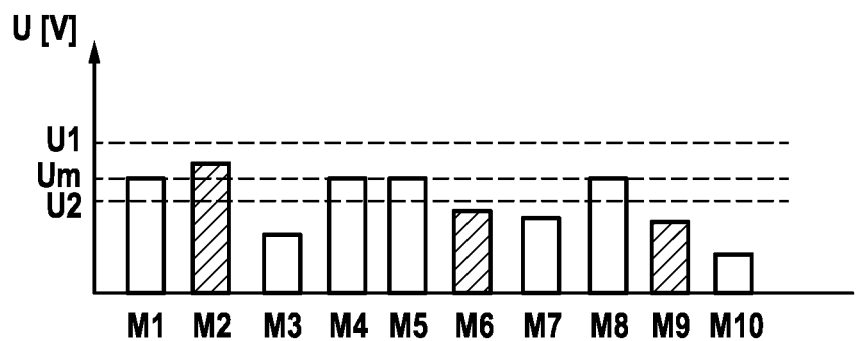
FIG. 2 shows a representation of voltage U and the operational readiness of electrical energy store modules M1, . . . M10 of the electrical energy store at a second point in time t2.

The voltages of various electrical energy store modules M1, . . . M10 at a second point in time t2 are represented in FIG. 2. In this case, the voltage of one operational electrical energy store module M1, . . . M10 is represented with the aid of a white bar and the voltage of a non-operational electrical energy store module M1, . . . M10 is represented with the aid of a hatched bar.

Second point in time t2 is temporally after first point in time t1 and shortly after the start-up of the electrical energy store.

At second point in time t2, those electrical energy store modules M1, . . . M10 are electroconductively connected to one another and to the connection means and/or to a device, which were operational at first point in time t1 and whose voltage was between first voltage U1 and second voltage U2. These are first electrical energy store module M1, fourth electrical energy store module M4, fifth electrical energy store module M5 and eighth electrical energy store module M8. When connecting these electrical energy store modules M1, M4, M5, M8, the voltage of these electrical energy store modules is equalized so that these electrical energy store modules M1, M4, M5, M8 each have a mean voltage Um.

Figure 3:
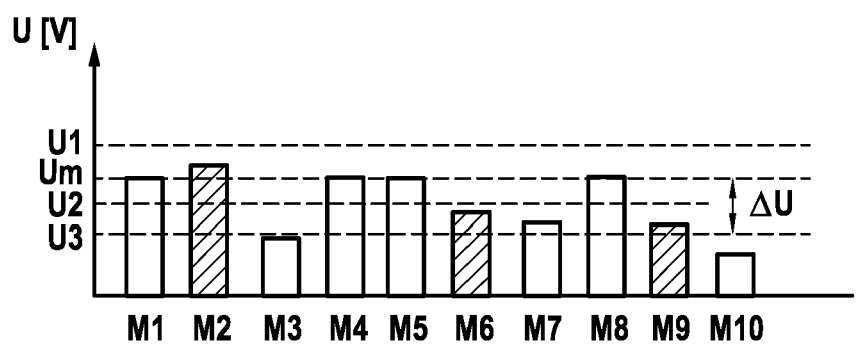
FIG. 3 shows a representation of voltage U and of the operational readiness of various electrical energy store modules M1, . . . M10 of the electrical energy store at a third point in time t3.

The voltages of various electrical energy store modules M1, . . . M10 at a third point in time t3 are represented in FIG. 3. In this case, the voltage of an operational electrical energy store module M1, . . . M10 is represented with the aid of a white bar and the voltage of a non-operational electrical energy store model M1, . . . M10 is represented with the aid of a hatched bar.

Third point in time t3 is temporally after first point in time t1 and after second point in time t2.

At third point in time t3, those electrical energy store modules M1, M4, M5, M8 are electroconductively connected to one another and to the connection means and/or to the device, which were electroconductively connected to one another and to the connection means and/or to the device at second point in time t2. These are first electrical energy store module M1, fourth electrical energy store module M4, fifth electrical energy store module M5 and eighth electrical energy store module M8.

The electrical energy store module M1, . . . M10 having the highest voltage U at third point in time t3 is second energy store module M2, however, the second energy store module is also not operational at third point in time t3.

The operational electrical energy store module M1, . . . M10 having the highest voltage are first, fourth, fifth and eighth electrical energy store module M1, M4, M5, M8, all of which have mean voltage Um.

Voltage range ΔU no longer extends from first voltage U1 up to second voltage U2 at third point in time t3, but from mean voltage Um to a third voltage U3, which is lower than second voltage U2. Third voltage U3 in this case is lower by ΔU than mean voltage Um.

All operational electrical energy store modules M1, . . . M10, whose voltage U is between mean voltage Um and third voltage U3, may be put into operation at third point in time t3. That is, in addition to first electrical energy store module M1, fourth electrical energy store module M4, fifth electrical energy store module M5 and eighth electrical energy store module M8, seventh electrical energy store module M7.

Voltages U of sixth electrical energy store module M6 and of ninth electrical energy store module M9 are also in voltage range ΔU between mean voltage Um and third voltage U3, however, sixth electrical energy store module M6 and ninth electrical energy store module M9 are not operational.

An electrical energy store module M1, . . . M10, whose voltage U is within voltage range ΔU may, once it becomes operational, also be switched on. Should an electrical energy store module M1, . . . M10, whose voltage is above mean voltage Um, in particular, above the sum of mean voltage Um and of half the voltage range ΔU, become operational, it may be switched on only after the next start of the electrical energy store.

Figure 4:
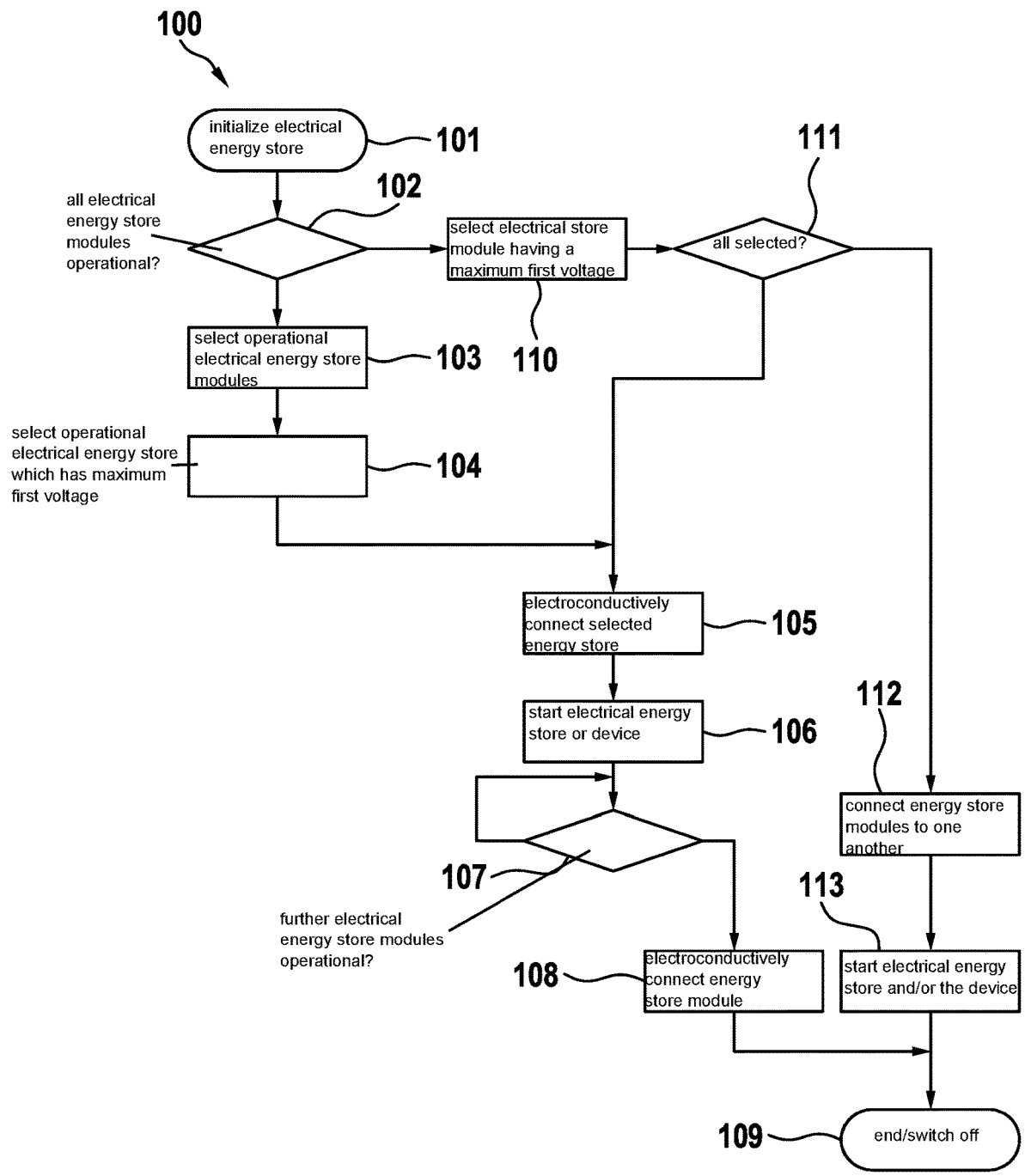
FIG. 4 schematically shows a flowchart of method 100 according to an example embodiment of the present invention for operating an electrical energy store.

A flowchart of method 100 according to the present invention for operating an electrical energy store is represented in FIG. 4. Method 100 for operating an electrical energy store includes the following steps:

In a first method step 101, the electrical energy store is initialized. In the process, respective operating parameters, in particular, a respective voltage U and/or a respective temperature and/or the respective charge state and, if necessary, further parameters, of respective energy store modules M1, . . . M10 are detected.

In a second method step 102 after first method step 101, it is queried whether all electrical energy store modules M1, . . . M10 of the electrical energy store are operational.

If not all electrical energy store modules M1, . . . M10 are operational, operational electrical energy store modules M1, . . . M10 are selected in a third method step 103 after second method step 102.

In a fourth method step 104 after third method step 103, that electrical energy store module M1, . . . M10 is selected from operational electrical energy store modules M1, . . . M10, which has a maximum first voltage U1. In this case, maximum first voltage U1 is greater than all other voltages U of operational electrical energy store modules M1, . . . M10. Those operational electric energy store modules M1, . . . M10 are then selected, whose respective voltage U is within a voltage range ΔU below first voltage U1.

In a fifth method step 105 after fourth method step 104 or after eleventh method step 111, electrical energy store modules M1, . . . M10 selected in fourth method step 104 or in tenth method step 110 are electroconductively connected to one another and to the connection means and/or to a device.

In a sixth method step 106 after fifth method step 105, the electrical energy store and/or the device is started with electrical energy store module M1, . . . M10 selected in fourth method step 104 or in tenth method step 110. The power of the electrical energy store in this case is reduced as compared to an operation including all electrical energy store modules M1, . . . M10. Voltages U of electrical energy store modules M1, . . . M10 are then equalized and a mean voltage Um occurs in all electrical energy store modules M1, . . . M10 electroconductively connected to one another.

In a seventh method step 107 after sixth method step 106, it is queried whether further electrical energy store modules M1, . . . M10 are operational and have a voltage U, which is within a voltage range ΔU below mean voltage Um of selected electrical energy store modules M1, . . . M10 and, if necessary, this electrical energy store module M1, . . . M10 is selected.

If in seventh method step 107 no electrical energy store module M1, . . . M10 has been selected, seventh method step 107 is repeated temporally recurrently, in particular, periodically.

If in seventh method step 107 an electrical energy store module M1, . . . M10 has been selected, in an eighth method step 108, this electrical energy store module M1, . . . M10 is electroconductively connected to electrical energy store modules M1, . . . M10 already electroconductively connected to one another and to the connection means and/or to the device.

Seventh method step 107 and eighth method step 108 are repeated until all electrical energy store modules M1, . . . M10 are electroconductively connected to one another and to the connection means and/or to the device, or method 100 is terminated in a ninth method step 109 and the electrical energy store and/or the device is/are switched off.

If in second method step 102 all electrical energy store modules M1, . . . M10 are operational, that energy store module M1, . . . M10 of electrical energy store modules M1, . . . M10 having a maximum first voltage U1 is selected in a tenth method step 110 after second method step 102. In this case, maximum first voltage U1 is greater than all other voltages U of electrical energy store modules M1, . . . M10. Those electrical energy store modules M1, . . . M10 are thereafter selected, whose respective voltage U is within a voltage range ΔU below first voltage U1.

In an eleventh method step 111 after tenth method step 110, it is queried whether all electrical energy store modules M1, . . . M10 have been selected in tenth method step 110.

If not all electrical energy store modules M1, . . . M10 have been selected in tenth method step 110, the method is continued after eleventh method step 111 with fifth method step 105.

If in tenth method step 110 all electrical energy store modules M1, . . . M10 of the electrical energy store have been selected, all electrical energy store modules M1, . . . M10 are electroconductively connected to one another in a twelfth method step 112 and to the connection means and/or to the device.

In a thirteenth method step 113 after twelfth method step 112, the electrical energy store and/or the device is started with all electrical energy store modules M1, . . . M10.

After thirteenth method step 113, the method is terminated in ninth method step 109 and the electrical energy store and/or the device is/are switched off.

The respective electroconductive connection between respective electrical energy store modules M1, . . . M10 and the connection means and/or the device is preferably separated after the ninth method step.

An electrical energy store in this case is understood to mean a rechargeable energy store, in particular, including an electrochemical energy store cell and/or an energy store module including at least one electrochemical energy store cell and/or one energy store pack including at least one energy store module. The energy store cell is implementable as a lithium-based battery cell, in particular, a lithium ion battery cell. Alternatively, the energy store cell is designed as a lithium polymer battery cell or a nickel metal hydride battery cell or a lead acid battery cell or a lithium air battery cell or a lithium sulfur battery cell.

Figure 5:
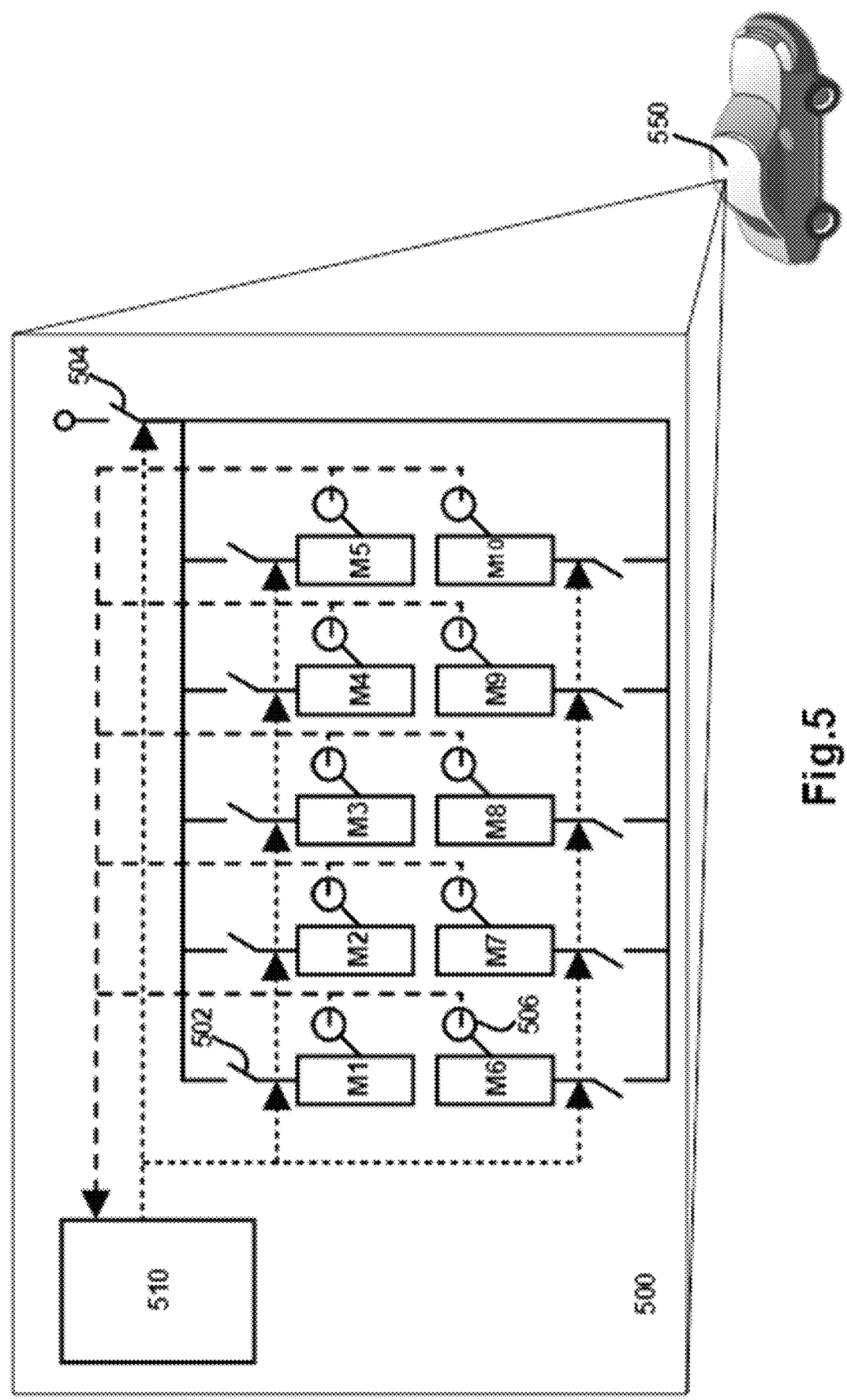
FIG. 5 illustrates a schematic representation of an electrical energy store according to an example embodiment of the present invention.

According to an example embodiment of the present invention, as illustrated in FIG. 5, an electrical energy store 500 includes a control unit 510, a main switch 504 by which the electrical energy store is connectable to a load and/or energy source, a plurality of electrical energy store modules M1-M10, and, for each of the electrical energy store modules M1-M10, a respective module switch 502 and sensor 506, such as a voltmeter or temperature sensor. The control unit 510 can obtain signals from the sensors 506, control the switch 504 for connecting to a load or energy source, and control the switches 502 for selective parallel interconnections of the electrical energy store modules M1-M10. The electrical energy store 500 is shown as being incorporated in a vehicle 550.

What is claimed is:

1. A method for operating an electrical energy store, which includes at least two electrical energy store modules interconnectable in parallel, the method comprising the following steps:

initially querying which electrical energy store modules of the electrical energy store modules of the energy store are operational;
determining a first voltage which is a greatest of all voltages of all of the operational electrical energy store modules; and
based on the determination:
  selecting all of those of the operational electrical energy store modules whose respective voltages are within a voltage range, the voltage range being obtained by applying a predefined voltage difference to the first voltage, with the first voltage forming a highest voltage of the voltage range; and
  selectively electroconductively interconnecting to one another only the selected ones of the operational electrical energy store modules, so that each of the operational electrical energy store modules whose respective voltage is outside of the voltage range is not connected, wherein the connecting reduces the greatest of all voltages, so that the voltage range having the predefined voltage difference is lowered, thereby causing additional ones of the operational electrical energy store modules to be connected;
wherein the method includes at least one of the following features (I)-(II):
  (I) when a particular one of the electrical energy store modules which is non-operational has a voltage which is greater than a mean voltage of the interconnected ones of the operational electrical energy stores and less than a sum of the mean voltage and of half the predefined voltage difference, a number of the electrical energy store modules that are interconnected remains constant until (a) the particular electrical energy store module becomes operational whereupon the particular electrical energy store is interconnected with the previously interconnected ones of the operational electrical energy stores, or (b) a voltage of the particular electrical energy store module is greater than the sum of the mean voltage and of half the predefined voltage difference; and
  (II) when a particular electrical energy store module, of the electrical energy store modules, whose voltage is greater than a sum of the mean voltage and of half the predefined voltage difference, becomes operational during performance of a first instance of the method, the particular electrical energy store module is not electroconductively interconnected to the previously interconnected ones of the operational electrical energy stores until completion of an entirety of the first instance of the method.

2. The method as recited in claim 1, wherein all of the electrical energy store modules are separated from one another when the electrical energy store is switched off.

3. The method as recited in claim 1, wherein an extent of the predefined voltage difference is a function of a switch of the electrical energy store.

4. The method as recited in claim 1, wherein an electrical energy store module of the electrical energy stores is operational when its temperature and/or its voltage and/or its charge state, is below a maximum limiting value and/or above a minimum limiting value.

5. The method as recited in claim 1, further comprising:
  (i) based on not all electrical energy store modules having been interconnected, querying again at a later point in time during operation of the electrical energy store, which of the electrical energy store modules are operational and that electrical energy store module is selected, whose voltage is within the predefined voltage difference below a mean voltage of the interconnected ones of the electrical energy store modules, and is electroconductively interconnected to the previously interconnected ones of the electrical energy stores.

6. The method as recited in claim 5, wherein the method steps of (i) are repeated until all electrical energy store modules are electroconductively interconnected or the electrical energy store is switched off, the method steps of (i) being repeated periodically.

7. The method as recited in claim 5, wherein when the particular one of the electrical energy store modules which is non-operational has the voltage which is greater than the mean voltage of the interconnected ones of the operational electrical energy stores and less than a sum of the mean voltage and of half the predefined voltage difference, the number of the electrical energy store modules that are interconnected remains constant until (a) the particular electrical energy store module becomes operational whereupon the particular electrical energy store is interconnected with the previously interconnected ones of the operational electrical energy stores, or (b) the voltage of the particular electrical energy store module is greater than the sum of the mean voltage and of half the predefined voltage difference.

8. The method as recited in claim 5, wherein when the particular electrical energy store module, of the electrical energy store modules, whose voltage is greater than the sum of the mean voltage and of half the predefined voltage difference, becomes operational during the performance of the first instance of the method, the particular electrical energy store module is not electroconductively interconnected to the previously interconnected ones of the operational electrical energy stores until the completion of the entirety of the first instance of the method.

9. An electrical energy store comprising:
at least two energy store modules which are interconnectable in parallel;
wherein the electrical energy store is configured to be operated by performance of a method that includes:
initially querying which electrical energy store modules of the electrical energy store modules of the energy store are operational;
determining a first voltage which is a greatest of all voltages of all of the operational electrical energy store modules; and
based on the determination:
selecting all of those of the operational electrical energy store modules whose respective voltages are within a voltage range, the voltage range being obtained by applying a predefined voltage difference to the first voltage, with the first voltage forming a highest voltage of the voltage range; and
selectively electroconductively interconnecting to one another only the selected ones of the operational electrical energy store modules, so that each of the operational electrical energy store modules whose respective voltage is outside of the voltage range is not connected, wherein the connecting reduces the greatest of all voltages, so that the voltage range having the predefined voltage difference is lowered, thereby causing additional ones of the operational electrical energy store modules to be connected;
wherein the method further includes at least one of the following features (I)-(II):

(I) when a particular one of the electrical energy store modules which is non-operational has a voltage which is greater than a mean voltage of the interconnected ones of the operational electrical energy stores and less than a sum of the mean voltage and of half the predefined voltage difference, a number of the electrical energy store modules that are interconnected remains constant until (a) the particular electrical energy store module becomes operational whereupon the particular electrical energy store is interconnected with the previously interconnected ones of the operational electrical energy stores, or (b) a voltage of the particular electrical energy store module is greater than the sum of the mean voltage and of half the predefined voltage difference; and (II) when a particular electrical energy store module, of the electrical energy store modules, whose voltage is greater than a sum of the mean voltage and of half the predefined voltage difference, becomes operational during performance of a first instance of the method, the particular electrical energy store module is not electroconductively interconnected to the previously interconnected ones of the operational electrical energy stores until completion of an entirety of the first instance of the method.

10. The electrical energy store as recited in claim 9, wherein the electrical energy store includes a control unit, each of the electrical energy store modules includes at least one sensor, the at least one sensor being a voltage sensor and/or a temperature sensor, and the electrical energy store further includes a switching arrangement configured to implement the electroconductive interconnection, and wherein the control unit is configured to evaluate signals of the sensors and to activate the switching arrangement.

11. A device, comprising:
an electrical energy store including at least two energy store modules which are interconnectable in parallel;
wherein the electrical energy store is configured to be operated by performance of a method that includes:
initially querying which electrical energy store modules of the electrical energy store modules of the energy store are operational;
determining a first voltage which is a greatest of all voltages of all of the operational electrical energy store modules; and
based on the determination:
selecting all of those of the operational electrical energy store modules whose respective voltages are within a voltage range, the voltage range being obtained by applying a predefined voltage difference to the first voltage, with the first voltage forming a highest voltage of the voltage range; and
selectively electroconductively interconnecting to one another only the selected ones of the operational electrical energy store modules, so that each of the operational electrical energy store modules whose respective voltage is outside of the voltage range is not connected, wherein the connecting reduces the greatest of all voltages, so that the voltage range having the predefined voltage difference is lowered, thereby causing additional ones of the operational electrical energy store modules to be connected;
wherein the method further includes at least one of the following features (I)-(II):

(I) when a particular one of the electrical energy store modules which is non-operational has a voltage which is greater than a mean voltage of the interconnected ones of the operational electrical energy stores and less than a sum of the mean voltage and of half the predefined voltage difference, a number of the electrical energy store modules that are interconnected remains constant until (a) the particular electrical energy store module becomes operational whereupon the particular electrical energy store is interconnected with the previously interconnected ones of the operational electrical energy stores, or (b) a voltage of the particular electrical energy store module is greater than the sum of the mean voltage and of half the predefined voltage difference; and (II) when a particular electrical energy store module, of the electrical energy store modules, whose voltage is greater than a sum of the mean voltage and of half the predefined voltage difference, becomes operational during performance of a first instance of the method, the particular electrical energy store module is not electroconductively interconnected to the previously interconnected ones of the operational electrical energy stores until completion of an entirety of the first instance of the method.

12. The device as recited in claim 11, wherein the device is a vehicle.

* * * * *